United States Patent [19]
André et al.

[11] Patent Number: 5,325,319
[45] Date of Patent: Jun. 28, 1994

[54] FILTERING A SIGNAL WITH THE USE OF APPROXIMATE ARITHMETICAL DIVISION

[75] Inventors: Tore M. André, Bandhagen; Mansoor F. Khan, Huddinge, both of Sweden

[73] Assignee: Telefonaktiebolaget L M Ericsson, Stockholm, Sweden

[21] Appl. No.: 144,423

[22] Filed: Nov. 2, 1993

Related U.S. Application Data

[63] Continuation of Ser. No. 591,878, Oct. 2, 1990.

[30] Foreign Application Priority Data

Oct. 4, 1989 [SE] Sweden .................. 8903265-0

[51] Int. Cl.⁵ .................. G06F 15/31; G06F 7/52
[52] U.S. Cl. .................. 364/724.19; 364/764
[58] Field of Search .............. 364/764, 765, 761, 726, 364/715.01, 715.08, 724.19

[56] References Cited

U.S. PATENT DOCUMENTS

| | | | |
|---|---|---|---|
| 4,181,976 | 1/1980 | Collins et al. | 364/726 X |
| 4,607,343 | 8/1986 | Chevillat et al. | 364/765 |
| 4,707,798 | 11/1987 | Nakano | 364/765 |
| 4,726,036 | 2/1988 | Sawyer et al. | 375/14 |
| 4,782,457 | 11/1988 | Cline | 364/714.08 X |
| 4,797,849 | 1/1989 | Nakano | 364/765 |
| 4,872,184 | 10/1989 | Yamaguchi et al. | 375/14 |
| 4,989,170 | 1/1991 | Batruni et al. | 364/724.19 |

FOREIGN PATENT DOCUMENTS 0322060  6/1989  European Pat. Off.
0345675 12/1989  European Pat. Off.

OTHER PUBLICATIONS

Principles of Digital Computer Design, vol. 1, Ab-d-alla, Metzer, N.J., 1976 av Prentice Hall, pp. 65-67; 3.4.4 "High Speed Division Techniques".

*Primary Examiner*—Tan V. Mai
*Attorney, Agent, or Firm*—Burns, Doane, Swecker & Mathis

[57] ABSTRACT

Filtering a signal with an adaptive digital filter includes updating the filter by performing an approximate division of a constant number by a variable number in binary form. The variable number represents a magnitude of energy of the signal to be filtered, and consists of a character bit and a plurality of bits which define the absolute value of the number. The variable number is first transformed by substituting with logic zeros any logic ones that have a lower significance than the most significant logic one of the bits. The first transformed number is then further transformed by reading the character bit of the variable number as a character bit and by reading the bits in the digital word in a reversed order. The resulting value is applied to adjust the adaptive digital filter which filters the signal.

3 Claims, 3 Drawing Sheets

| +/- | $\frac{1}{2}$ | $\frac{1}{4}$ | $\frac{1}{8}$ | $\frac{1}{16}$ | | | | | | | +/- | $\frac{1}{2}$ | $\frac{1}{4}$ | $\frac{1}{8}$ | $\frac{1}{16}$ | |
|---|---|---|---|---|---|---|---|---|---|---|---|---|---|---|---|---|
| 0 . | 0 | 0 | 0 | 1 | = 1/16 | 0 | 0 | 0 | 1 | | 0 . | 1 | 0 | 0 | 0 | = 1/2 |
| 0 . | 0 | 0 | 1 | 0 | = 1/8 | 0 | 0 | 1 | 0 | | 0 . | 0 | 1 | 0 | 0 | = 1/4 |
| 0 . | 0 | 0 | 1 | 1 | = 3/16 | 0 | 0 | 1 | 0 | | 0 . | 0 | 1 | 0 | 0 | = 1/4 |
| 0 . | 0 | 1 | 0 | 0 | = 1/4 | 0 | 1 | 0 | 0 | | 0 . | 0 | 0 | 1 | 0 | = 1/8 |
| 0 . | 0 | 1 | 0 | 1 | = 5/16 | 0 | 1 | 0 | 0 | | 0 . | 0 | 0 | 1 | 0 | = 1/8 |
| 0 . | 0 | 1 | 1 | 0 | = 6/16 | 0 | 1 | 0 | 0 | | 0 . | 0 | 0 | 1 | 0 | = 1/8 |
| 0 . | 0 | 1 | 1 | 1 | = 7/16 | 0 | 1 | 0 | 0 | | 0 . | 0 | 0 | 1 | 0 | = 1/8 |
| 0 . | 1 | 0 | 0 | 0 | = 1/2 | 1 | 0 | 0 | 0 | | 0 . | 0 | 0 | 0 | 1 | = 1/16 |
| 0 . | 1 | 0 | 0 | 1 | = 9/16 | 1 | 0 | 0 | 0 | | 0 . | 0 | 0 | 0 | 1 | = 1/16 |
| ⋮ | | | | | | ⋮ | | | | | ⋮ | | | | | |
| 0 . | 1 | 1 | 1 | 1 | = 15/16 | 1 | 0 | 0 | 0 | | 0 . | 0 | 0 | 0 | 1 | = 1/16 |
| 0 . | 0 | 0 | 0 | 0 | = 0/16 | 0 | 0 | 0 | 0 | | 0 . | 0 | 0 | 0 | 0 | = 0/16 |

Fig.1

| +/− | 2 | 1 | ½ | ¼ | | | | | | +/− | 2 | 1 | ½ | ¼ | | | | |
|---|---|---|---|---|---|---|---|---|---|---|---|---|---|---|---|---|---|---|
| 0 | 0 | 0 . | 0 | 1 = ¼ | 0 | 0 | 0 | 1 | | 0 | 1 | 0 . | 0 | 0 = 2 | | | | |
| 0 | 0 | 0 . | 1 | 0 = ½ | 0 | 0 | 1 | 0 | | 0 | 0 | 1 . | 0 | 0 = 1 | | | | |
| 0 | 0 | 0 . | 1 | 1 = ¾ | 0 | 0 | 1 | 0 | | 0 | 0 | 1 . | 0 | 0 = 1 | | | | |
| 0 | 0 | 1 . | 0 | 0 = 1 | 0 | 1 | 0 | 0 | | 0 | 0 | 0 . | 1 | 0 = ½ | | | | |
| 0 | 0 | 1 . | 0 | 1 = 1¼ | 0 | 1 | 0 | 0 | | 0 | 0 | 0 . | 1 | 0 = ½ | | | | |
| 0 | 0 | 1 . | 1 | 0 = 1½ | 0 | 1 | 0 | 0 | | 0 | 0 | 0 . | 1 | 0 = ½ | | | | |
| 0 | 0 | 1 . | 1 | 1 = 1¾ | 0 | 1 | 0 | 0 | | 0 | 0 | 0 . | 1 | 0 = ½ | | | | |
| 0 | 1 | 0 . | 0 | 0 = 2 | 1 | 0 | 0 | 0 | | 0 | 0 | 0 . | 0 | 1 = ¼ | | | | |
| 0 | 1 | 0 . | 0 | 1 = 2¼ | 1 | 0 | 0 | 0 | | 0 | 0 | 0 . | 0 | 1 = ¼ | | | | |
| . | | | | | . | | | | | . | | | | | | | | |
| . | | | | | . | | | | | . | | | | | | | | |
| . | | | | | . | | | | | . | | | | | | | | |
| 0 | 1 | 1 . | 1 | 1 = 3¾ | 1 | 0 | 0 | 0 | | 0 | 0 | 0 . | 0 | 1 = ¼ | | | | |
| 0 | 0 | 0 . | 0 | 0 = 0 | 0 | 0 | 0 | 0 | | 0 | 0 | 0 . | 0 | 0 = 0 | | | | |

Fig. 2

FILTERING A SIGNAL WITH THE USE OF APPROXIMATE ARITHMETICAL DIVISION

This application is a continuation of application Ser. No. 07/591,878, filed Oct. 2, 1990.

FIELD OF THE INVENTION

The present invention relates to a method of updating an adaptive digital filter performing an approximate arithmetical division of a constant number by a variable number in binary form. The value of the variable number represents the signal energy of an input signal to the filter and exists in the form of electric signals which represent logic ones and logic zeros. The variable number includes a character bit, N1 whole-number bits and N2 binary fraction bits, where $N1 \geq 0$ and $N2 \geq 0$.

The present invention also relates to an adaptive digital for performing an approximate division of a constant variable number by a number in binary form. The variable number includes a character bit, N1 whole-number bits and N2 binary fraction bits, where $N1 \geq 0$ and $N2 \geq 0$. A first input is used for obtaining character bit. $N1+N2$ inputs are used for obtaining the whole-number bits and binary fraction bits. A first output is used for handling a character bit $N1+N2$ outputs are used for handling whole-number bits and binary fraction bits.

BACKGROUND OF THE INVENTION

When updating an adaptive digital filter in accordance, for instance, with the LMS-algorithm (Least Mean Square), there is calculated a convergence factor which defines the stop size. In order for the filter to function in the manner desired for different input signals, the step size must be inversely proportional to the signal energy of the filter input signal. When calculating this convergence factor there is therefore a need to divide a constant number by a variable number whose value represents the signal energy. Division operations, however, are often relatively demanding processes and thereby also relatively time consuming.

For instance, an arithmethical division operation according to one known method is performed as a series of repeated, conditional subtractions. The absolute accuracy obtained is proportional to the number of iterations. Arithmethical division operations can also be performed with the aid of equipment that has a relatively large memory capacity. One example in this regard is found described in U.S. Pat. No. 4,707,798, according to which an approximate arithmethical division is effected by table loop-up memory in combination with interpolation.

SUMMARY OF THE INVENTION

One object of the present invention is to provide a method which will enable an arithmetical division of the kind mentioned in the background to be carried out rapidly and with the aid of simple equipment. This is achieved in two stages. There is first formed a digital word, by substituting with logic zeroes any logic ones which have a lower significance than the most significant logic one of the bits which give the absolute value of the variable number. There is then formed in binary form a new number which has similar character bits to the variable number, and the bits in the digital word are read in the reverse sequence.

Although the division achieved when practicing the method is not exact, it is, however, sufficiently exact for calculating the convergence factor when updating adaptive filters. For instance, it will be obvious that a high signal energy will give rise to a low convergence factor, and vice versa.

Another object of the invention is to provide an arrangement of the aforesaid kind of simple construction which will enable an approximate division to be carried out rapidly. The device comprises essentially only one logic device which functions to substitute with logic zeroes any logic ones that have a lower significance than the most significant logic one.

BRIEF DESCRIPTION OF THE DRAWINGS

The invention will now be described in more detail with reference to the accompanying drawings, in which:

FIGS. 1 and 2 are tables illustrating examples of the relationship between mutually different input values and output values in binary form when performing an invention division operation, and also different digital words which are constructed as a link in such a division.

DETAILED DESCRIPTION OF THE PREFERRED EMBODIMENTS OF THE INVENTION

Figure 3:
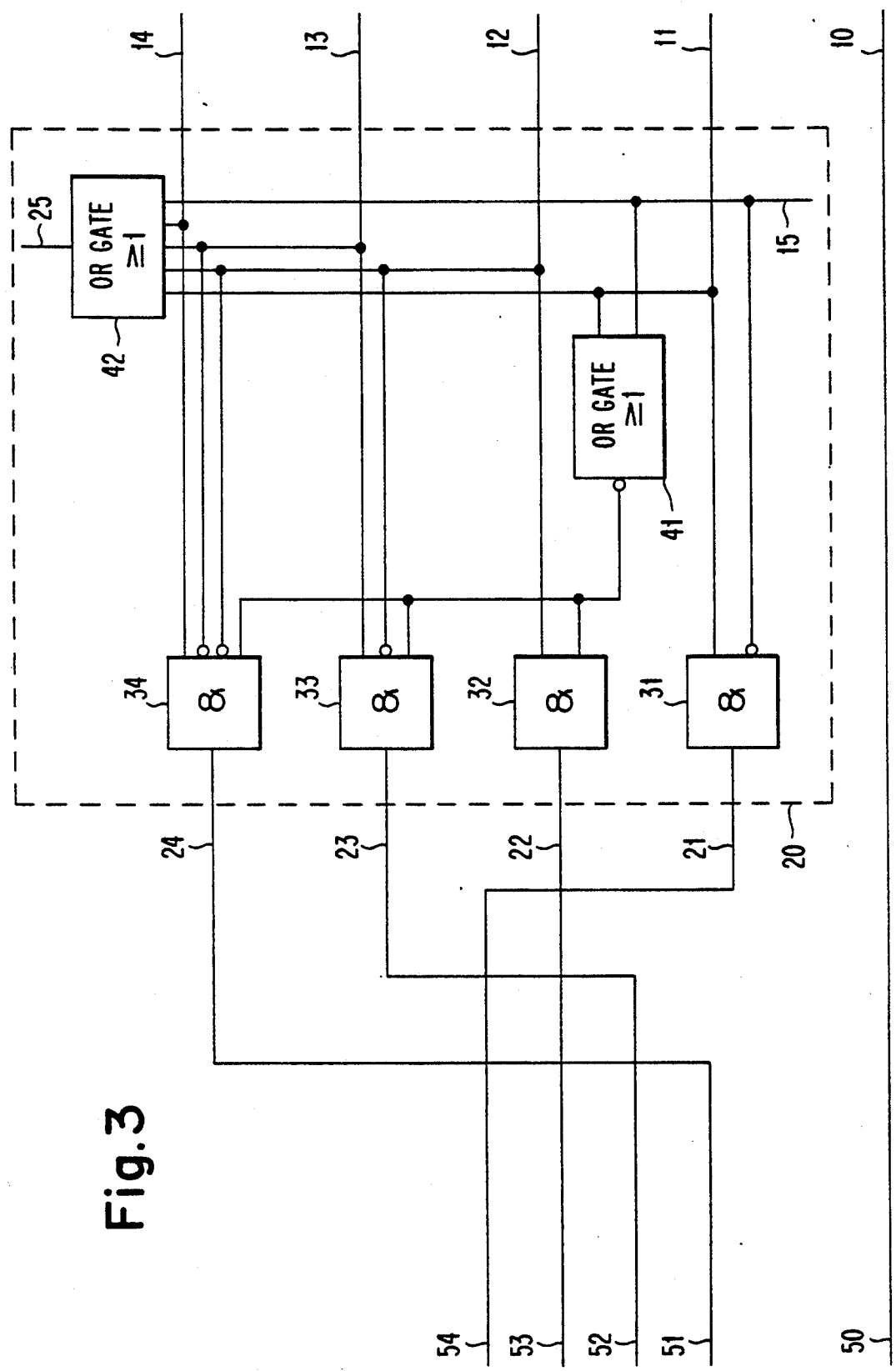
FIG. 3 illustrates a gate network which constitutes an example of an apparatus for carrying out an inventive division operation.

In FIG. 1, the column furthest to the left in the table shows examples of different numbers in binary form whose values vary between zero and 15/16. The first bit in each number is a character bit and has zero value, which in the case of the illustrated example signifies that the number is positive. The point following the first zero is a so-called binary point and indicates that the subsequent bits have the values $\frac{1}{2}$, $\frac{1}{4}$, $\frac{1}{8}$ and 1/16, as will also be seen from FIG. 1. Thus, the illustrated binary numbers do not include a whole-number bit, but include solely one character bit and four so-called binary fraction bits.

When effecting arithmetical division in accordance with the invention, corresponding to an approximative division of a constant number by one of the binary numbers in the left-hand column, a digital word is formed from the binary fraction bits in a first stage of the process, i.e. from the four bits to the right of the character bit in the binary number. Different digital words of this kind are shown in the centre column of FIG. 1. Each of these words is formed by substituting with logic zeroes any logic ones which have a lower significance than the most significant logic one in the binary number. Each such digital word will thus consist of a single logic one and three logic zeroes, with the exception of the lowermost word in the table, which corresponds to the binary number zero and which consists of four logic zeroes.

A new number is formed in binary form in a second stage, and the right-hand column of FIG. 1 illustrates the different number thus formed. Each of the new numbers has a character bit similar to corresponding numbers in the left-hand column, and the binary point is located in the same position as in the corresponding number. The binary bits which follow the binary point coincides with the bits in corresponding digital words in the centre column, but are read in the reverse order.

It will be seen from the table, that the number 1/16 is converted to the number ½, the number ⅛ and 3/16 are converted to the number ¼, the numbers ¼-7/16 are converted to ⅛, the numbers ⅛-15/16 are converted to the number 1/16 and the number zero remains zero. Thus, with the exception of the number zero, a number of relatively high value results in a number of relatively low value, and vice versa. According to the described method, attention is paid solely to the most significant logic one of the variable number, and consequently several, mutually different input values can result in one and the same output value. Nevertheless, the method can be seen as an approximate division of a constant number by the variable number. In the case of those binary numbers which have only one single logic one, i.e. the numbers 1/16, ⅛, ¼, and ½, the method provides an exact division between the constant number 1/32 and the number concerned. For instance, the number 1/16 which in binary form is written as 0.0001 is converted to 0.1000, which is equal to ½. The number 15/16 which in binary form is written as 0.111 is, however, converted to 1/16. If this division is to correspond to a division with 15/16, the numerator will therewith be 15/(16×16)=30/(16×32), i.e. almost 2×1/32. This numerator is thus almost twice as large as the numerator calculated in the aforegoing, i.e. when considering binary numbers which contain only a single logic one. Thus, for all binary numbers in the table, with the exeption of the number zero, the division method can be said to correspond to an approximate division of a constant number whose value lies approximately in the middle of 1/32 and 2/32 and the binary number concerned.

In the foregoing it has been assumed throughout that the binary numbers are positive. In that instance when the numbers are presented in character-value representation, the division method would also correspond to an approximate division of negative numbers. With such representation, a positive and an equally large negative number would differ solely with respect to the character bits. This does not apply, however, in two complement representation.

Since division with zero is not a defined operation, the division of the number zero can, in principle, be arbitrarily selected. In the present case, it has been considered appropriate for the number zero to result in the number zero subsequent to the division. This is because when the division process is applied in conjunction with adjustment to the settings of adaptive filters, it is probable that the number zero on the converter input originates from a momentarily "silent" transmission channel. This shall not result in an adjustment or charge to the filter setting.

FIG. 2 illustrates a second table that contains various numbers in binary form. These number coincide with the numbers in the table of FIG. 1, but with the binary point having been moved two places to the right. The numbers therefore have two whole-number bits having the values 2 and 1, and two binary fraction bits having the values ½ and ¼, which are marked in FIG. 2. The numbers are converted according to the same principle as that applied with the numbers shown in FIG. 1, and the digital words in the centre column therefore coincide exactly with corresponding words in FIG. 1. In this case, the converted numbers in the right-hand column include two binary bits to the right of the binary point, i.e. two binary fraction bits.

In this case, the arithmetic division of binary numbers which have solely a single logic one corresponds to the division of ½ by the number concerned. For instance, ¼ is converted to 2. The number 3-¾ is written in binary form as 011.11 and is converted to ¼. This corresponds to a division of the number (30/16)×¼, i.e. almost 2×¼, by the number 3-¾. In the case of the binary numbers shown in the table of FIG. 2, the division method will thus correspond to an approximate division of a constant number whose value lies roughly centrally between ½ and 1, and the binary number concerned. As in the earlier case, the number zero is an exception, since this number is not changed at all.

FIG. 3 illustrates an exemplifying embodiment of an arrangement for carrying out an approximate division in accordance with the aforegoing. The arrangement has five inputs 10-14 and five outputs 50-54. The input 10 is connected to the output 50 and is intended to be supplied with the character bit of a binary input number. The character bit is thus transmitted unchanged from the input 10 to the output 50. The most significant bit, the next most significant bit and so on of the input number are applied to the inputs 11-14 in that sequence. The inputs 11-14 are connected to a logic device 20 having outputs 21-24. The logic device 20 will be described in more detail hereinafter, and functions to find the most significant logic one on the inputs 11-14 and to substitute with logic zeroes any logic ones of lower significance. The digital words shown in the centre columns in FIGS. 1 and 2 are thus handled on the outputs 21-24.

The outputs 21-24 from the device 20 are connected to the outputs 51-54 of said device, by coupling the output 21 to the output 54, the output 22 to the output 53, and so on. In this way, the bits in the digital word from the device 20 will occur in a reversed order on the outputs 51-54 of said device. The character bit on the output 50 and the bits on the output 51-54 thus form the binary words shown in the respective right-hand columns of FIGS. 1 and 2.

In the case of illustrated example the device 20 comprises a gate network which includes four AND-gates 31-34 and two OR-gates 41-42 and is intended to convert binary numbers which have four binary bits in addition to the character bits. An input 15 and an output 25 are intended for so-called carry bits which are used when several gate networks of the illustrated kind are connected in cascade. This makes it possible to convert binary numbers comprising more than four bits. If the gate network is not cascade-connected to a similar network for bits of higher significance than the bit on the input 11, a logic zero is sent to the carry input 15.

A logic zero on the carry input 15 will hold the gate 31 open for a possible logic one on the input 11 for the most significant bit in a binary number supplied to the network. If the mos significant bit is a logic one, a logic one will therefore also appear on the output 21 of the gate 31. The presence of a logic one on the input 11 will also result in the presence of a logic zero on a negated output of the gate 41, and this logic zero will latch the gates 32-34 so that logic zeroes occur on the outputs 22-24 irrespective of whether logic ones or logic zeroes appear on the inputs 12-14. If the most significant bit is, instead, a logic zero, a logic zero will also appear on the output 21 and a logic one will appear on the output of the gate 41. This logic one holds the gate 32 open for a possible logic one on the input 12 for the next most significant bit of the binary number. A logic one on the input 12 will, at the same time, latch the gates 33 and 34, so that logic zeroes will appear on the outputs 23 and 24.

If the most significant logic one of the number appears on the input 13, a logic one will appear on the output 23 and the gate 34 will be held latched. A logic one will appear on the output 24 only if logic zeroes appear on the inputs 11–13 at the same time as a logic one appears on the input 14.

If a logic one appears on at least one of the inputs 11–14, a logic one will appear on the carry-output 25. When a logic one appears on the carry-input 15, the gates 31–34 are latched, which causes logic zeroes to appear on all outputs 21–24, and also on the carry output 25.

As will be understood, the logic ones and logic zeroes recited in the description above are, in practice, different electrical signals which represent such logic values.

While a particular embodiment of the present invention has been described and illustrated, it should be understood that the invention is not limited thereto since modifications may be made by persons skilled in the art. The present application contemplates any and all modifications that fall within the spirit and scope of the underlying invention disclosed and claimed herein.

We claim:

1. A method for filtering a first signal, comprising the steps of:

detecting a magnitude of signal energy of said first signal;

generating an energy signal comprising a set of $1+N1+N2$ bit signals which represent a sequence of logic ones and logic zeros in correspondence with a binary representation of said detected magnitude of signal energy, said binary representation including a character bit, N1 whole-number bits and N2 binary fraction bits, where $N1 \geq 0$ and $N2 \geq 0$;

first transforming said energy signal by identifying which of said set of $1+N1+N2$ bit signals corresponds to a most significant logic one in said binary representation of said detected magnitude of signal energy, and then setting equal to a logic zero each bit signal of said set of $1+N1+N2$ bit signals that corresponds to a bit of lower significance than that of said identified bit signal;

further transforming said first transformed energy signal by identifying a subset comprising those of said set of $1+N1+N2$ bit signals that correspond to said N1 whole-number bits and said N2 binary fractions bits, and then reversing order of said subset;

applying said first signal to a signal input of an adaptive digital filter; and using said further transformed energy signal to adjust a setting of said adaptive digital filter and operating said adaptive digital filter.

2. The method of claim 1, wherein the step of first transforming further comprises using said energy signal as said first transformed energy signal if said energy signal represents a magnitude of energy that is equal to zero.

3. The method of claim 1, wherein said first signal is a signal from a transmission channel.

* * * * *